(12) United States Patent
Kelly et al.

(10) Patent No.: US 7,554,194 B2
(45) Date of Patent: Jun. 30, 2009

(54) THERMALLY ENHANCED SEMICONDUCTOR PACKAGE

(75) Inventors: Michael G. Kelly, Phoenix, AZ (US); Ki Wook Lee, Seoul (KR); Chang Ho Jang, Seoul (KR)

(73) Assignee: Amkor Technology, Inc., Chandler, AZ (US)

( * ) Notice: Subject to any disclaimer, the term of this patent is extended or adjusted under 35 U.S.C. 154(b) by 0 days.

(21) Appl. No.: 11/557,884

(22) Filed: Nov. 8, 2006

(65) Prior Publication Data
US 2008/0122068 A1   May 29, 2008

(51) Int. Cl.
*H01L 23/36* (2006.01)
(52) U.S. Cl. ............................... 257/713; 257/E23.101
(58) Field of Classification Search .......... 257/E23.015, 257/713, 739
See application file for complete search history.

(56) References Cited

U.S. PATENT DOCUMENTS

| | | | |
|---|---|---|---|
| 5,642,261 A | 6/1997 | Bond et al. | |
| 5,693,572 A | 12/1997 | Bond et al. | |
| 5,903,052 A | 5/1999 | Chen et al. | |
| 5,991,156 A | 11/1999 | Bond et al. | |
| 6,400,021 B1 * | 6/2002 | Cho | 257/738 |
| 2004/0195685 A1 | 10/2004 | Chiu et al. | |
| 2005/0051890 A1 * | 3/2005 | Zhang et al. | 257/712 |
| 2007/0031996 A1 * | 2/2007 | Chopin et al. | 438/122 |

FOREIGN PATENT DOCUMENTS

JP          08-250625          9/1996

* cited by examiner

*Primary Examiner*—Sue Purvis
*Assistant Examiner*—Krista Soderholm
(74) *Attorney, Agent, or Firm*—Weiss & Moy, P.C.

(57) ABSTRACT

A semiconductor package has a substrate having a first surface, a second surface, and a through hole opening. A heat spreader has a first surface, a second surface, and a plurality of notches formed on the second surface. A semiconductor die is coupled to the first surface of the heat spreader. The semiconductor die is electrically coupled to the substrate. An encapsulant is used to cover portions of the first surface of the substrate, portions of the first surface of the heat spreader, and the semiconductor die. A first set of solder balls is coupled to the second surface of the substrate. A second set of solder balls is coupled to the second surface of the heat spreader wherein the second set of solder balls is located in the notches.

20 Claims, 5 Drawing Sheets

THERMALLY ENHANCED SEMICONDUCTOR PACKAGE

FIELD OF THE INVENTION

This invention relates to semiconductor packages and, more specifically, to thermally enhanced semiconductor package that provides enhanced pathways for dissipation of heat from the semiconductor package and heat spreader that enables the solder balls to retain a spherical shape.

BACKGROUND OF THE INVENTION

In the operation of a semiconductor device, heat is usually generated. The amount of heat generated will affect the operation and the efficiency of the semiconductor device. Thus, it is important for the heat to be dissipated from the semiconductor device. The heat may be dissipated from the semiconductor device in a number of different manners. For example, the heat may be dissipated into the surrounding ambient atmosphere through convection. In other instances the amount of heat generated by the semiconductor device may require the use of an external cooling mechanism. An example of an external cooling mechanism is a fan that blows cooling air over an integrated circuit to carry away heat.

Presently, some semiconductor devices remove the heat generated by using a heat spreader. The heat spreader will absorb the heat generated from the semiconductor device and transferred the heat to the ambient atmosphere or to some external heat sink.

A problem arises when a heat spreader is used in a Ball Grid Array (BGA) device. When a bottom side heat spreader is used in a BGA device, the heat spreader may be attached to a Printed Circuit Assembly (PCA) in one of two manners. First, the heat spreader may be directly soldered to the PCA. Second, solder balls may be attached to the heat spreader and the solder balls are used to attach the BGA device to the PCA. When the solder balls are attached to the heat spreader, it is difficult for the solder balls to retain a spherical shape. During a reflow process, each solder ball will typical wet out a greater area such that the solder ball will amount to a "mound" of solder as opposed to a near spherical shape. When this happens, all the solder balls will not be at a uniform height. Thus, it will be difficult for the solder balls to contact the PCA board.

Therefore, a need existed to provide a device and method that overcomes the above problems. The device and method will provide enhanced pathways for dissipation of heat from the semiconductor package by enabling solder balls to retain a spherical shape when attached to a heat spreader.

SUMMARY OF THE INVENTION

A semiconductor package has a substrate having a first surface, a second surface, and a through hole opening. A heat spreader has a first surface, a second surface, and a plurality of notches formed on the second surface. A semiconductor die is coupled to the first surface of the heat spreader. The semiconductor die is electrically coupled to the substrate. An encapsulant is used to cover portions of the first surface of the substrate, portions of the first surface of the heat spreader, and the semiconductor die. A first set of solder balls is coupled to the second surface of the substrate. A second set of solder balls is coupled to the second surface of the heat spreader wherein the second set of solder balls is located in the notches.

The present invention is best understood by reference to the following detailed description when read in conjunction with the accompanying drawings.

BRIEF DESCRIPTION OF THE DRAWINGS

Common reference numerals are used throughout the drawings and detailed description to indicate like elements.

DETAILED DESCRIPTION

Figure 1:
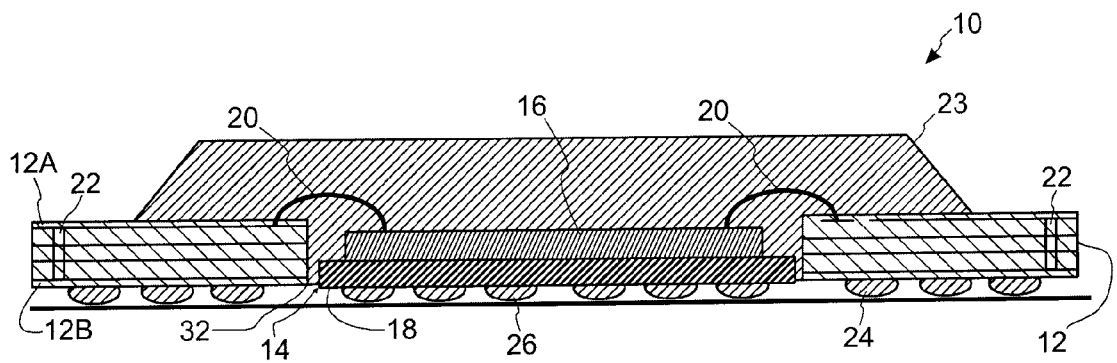
FIG. 1 is a cross-sectional view of a semiconductor package with enhanced thermal dissipation capabilities.

Referring to FIG. 1, a thermally enhanced semiconductor package 10 is shown. The semiconductor package 10 (herein package 10) is a BGA type of device having a substrate 12 having a first surface 12a, a second surface 12b, and a plurality of electrically conductive patterns formed thereon. A through hole opening 14 is formed in the substrate 12. The semiconductor package 10 will have a semiconductor die 16. A heat spreader 18 is provided having a first surface 32 and a second surface 30. The heat spreader 18 is attached to the semiconductor die 16. In general, the heat spreader 18 is attached to an inactive side of the semiconductor die 16.

The semiconductor die 16 and the heat spreader 18 are mounted in the through hole opening 14 in the substrate 12. In general, an adhesive tape or film is used to mount the semiconductor die 16 and the heat spreader 18 in the through hole opening 14 of the substrate 12. The semiconductor die 16 is then electrically coupled to the substrate 12. Wirebonds 20 are generally used to electrically couple the semiconductor die 16 to bond pads on the substrate 12. Plated vias 22 allow electrical connection between electrical patterns on the first surface 12a of substrate 12 and electrical patterns on the second surface 12b of substrate 12.

An encapsulant 23, formed of a plastic mold compound, an epoxy, a potting compound, or other conventional integrated circuit encapsulant, is used to cover the semiconductor die 16 and wirebonds 20. The encapsulant 23 provides environmental and mechanical protection for the semiconductor package 10.

A first set of solder balls 24 are disposed in an array manner beneath and in contact with the second surface 12b of the substrate 12. A second set of solder balls 26 are coupled to the second surface 30 of the heat spreader 18. The solder balls 26 in combination with the heat spreader 18 will provide an enhanced pathway for dissipation of heat generated by the semiconductor die 16. The solder balls 26 will transfer the heat absorbed by on the heat spreader 18 and transferred the heat to a PCA board or other external heat sink coupled to the semiconductor package 10.

A problem arises when the solder balls 26 are attached to the heat spreader 18. During the reflow process, it is difficult for the solder balls 26 to retain a spherical shape. Each solder ball 26 will typical wet out a greater area such that the solder ball 26 will flatten out and amount to a "mound" of solder as opposed to a near spherical ball shape. When this happens, the solder balls 26 will be at non uniform heights and at different heights from the solder balls 24. Thus, it will be difficult for the solder balls 26 to contact the PCA board. However, the heat spreader 18 is designed so that the surface area that is wetted by the solder ball 26 is confined. Since the surface tension of the solder is confined, the solder balls 26 are able to retain a spherical shape.

Figure 2:
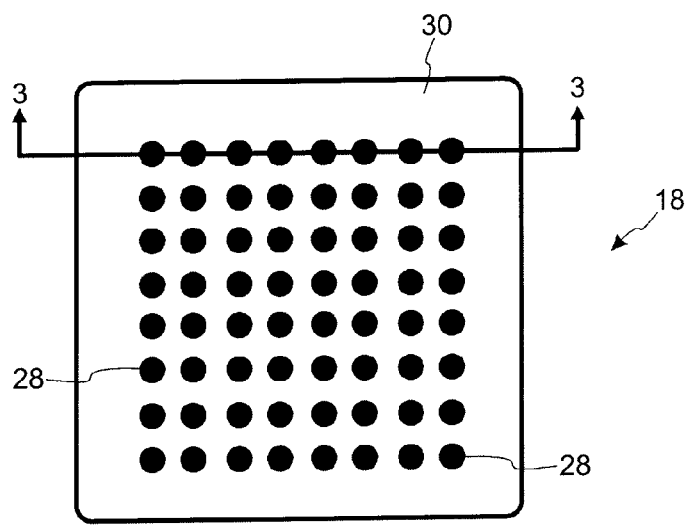
FIG. 2 is a top view of the heat spreader of the present invention.
Figure 3:
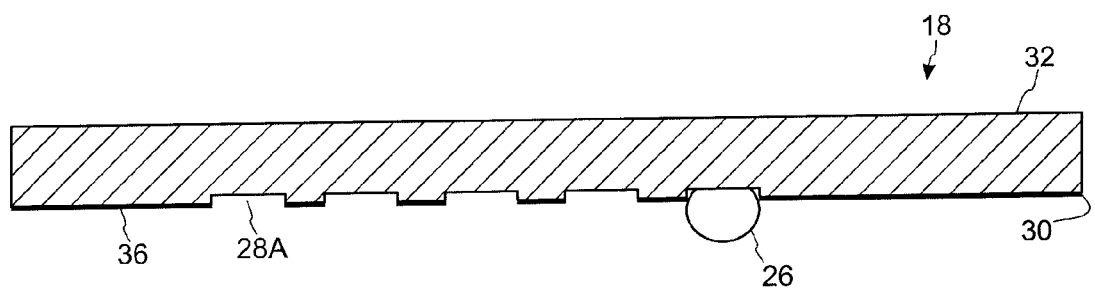
FIG. 3 is a cross-sectional view taken along lines 3-3 of the heat spreader of FIG. 2 with a solder ball attached.

Referring to FIGS. 2 and 3, the heat spreader 18 is shown in more detail. The heat spreader 18 will have a plurality of retaining members 28 formed on a surface 30 of the heat spreader 18. The plurality of retaining members 28 will be formed on the second surface 30 of the heat spreader 18 opposite of the first surface 32 that is coupled to the semiconductor die 16. The retaining members 28 may be formed on the second surface 30 of the heat spreader 18 in any desired solder ball configuration pattern.

As shown in FIG. 3, the retaining members 28 are a plurality of notches 28A. The plurality of notches 28A is formed in a size and depth to allow an upper section of the solder ball 26 to be placed in each notch 28A so that a top surface of the solder ball 26 touches a top section of the notch 28A. The notches 28A are used to provide a mechanically confining barrier to the solder balls 26 during the reflow process so that the solder balls 26 are able to retain a spherical shape.

Figure 4:
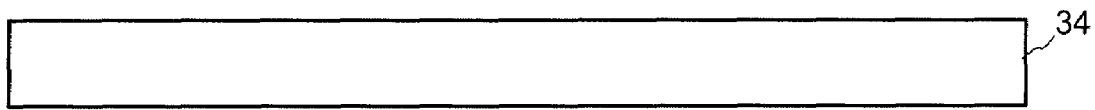
FIG. 4 is a process diagram showing the process of forming the heat spreader shown in FIG. 3.
Figure 4:
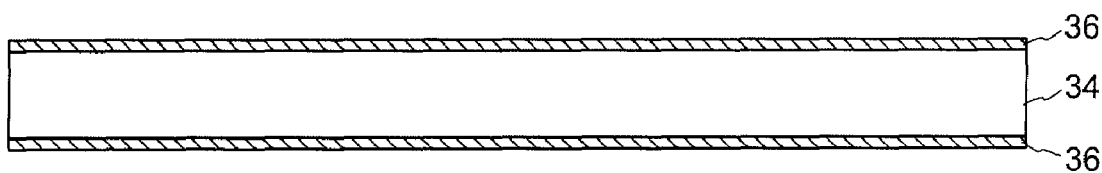
Figure 4:
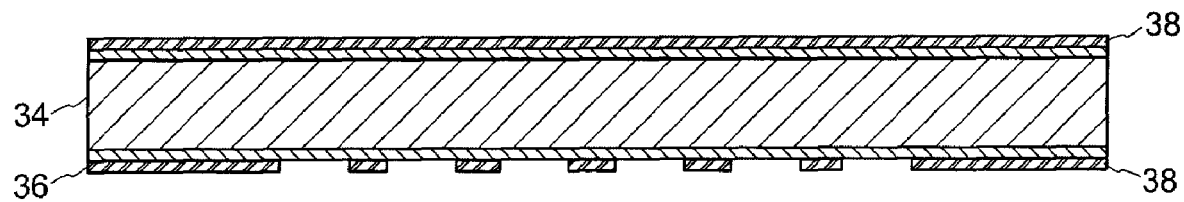
Figure 4:
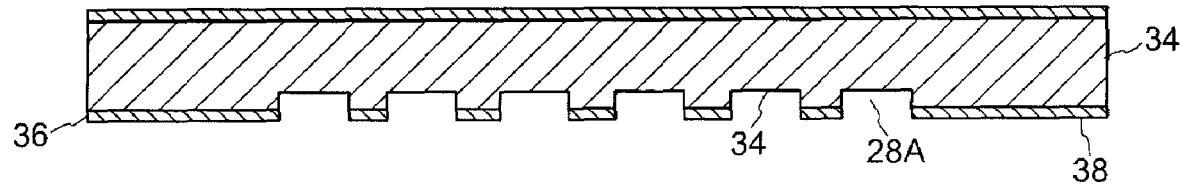

Referring to FIG. 4, the heat spreader 18 has a metal substrate 34. The metal substrate 34 is made of a material that has a high thermal conductivity and that conducts heat well. In general, a metal such as copper or the like is used. It should be noted that the above listing is given as an example and should not be seen as to limit the scope of the present invention. The metal substrate 34 is then plated with a metal layer 36. The metal layer 36 is a metal that solder does not wet well with. In general, a metal layer such as nickel, silver, gold, palladium, or the like is used as the metal layer 36. A retaining member pattern is formed on the metal layer 36 by applying an etch resist 38 to the metal layer 36. In the present embodiment, the retaining member pattern is a notch 28A. The retaining member pattern is formed in an array to match the desired solder ball configuration pattern. The etch resist 38 is applied on the second surface 30 of the heat spreader 18 opposite of the first surface 32 coupled to the semiconductor die 16. An etching process is then used to remove the metal layer 36 to expose portions of the metal substrate 34 and to form the plurality of notches 28A. Solder balls 26 are then positioned in each notch 28A. During the reflow process to couple the solder balls 26 to the heat spreader 18, since the metal layer 36 is a metal that solder does not wet well with, the notches 28A are able to contain the surface tension of the solder balls 26 so that the solder ball 26 is able to retain a spherical shape.

Figure 5:
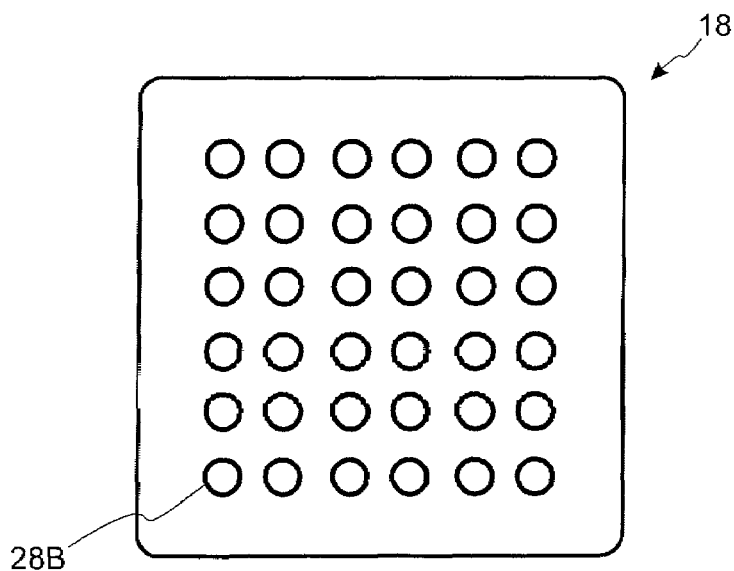
FIG. 5 is a top view of another embodiment of the heat spreader of the present invention.
Figure 6:
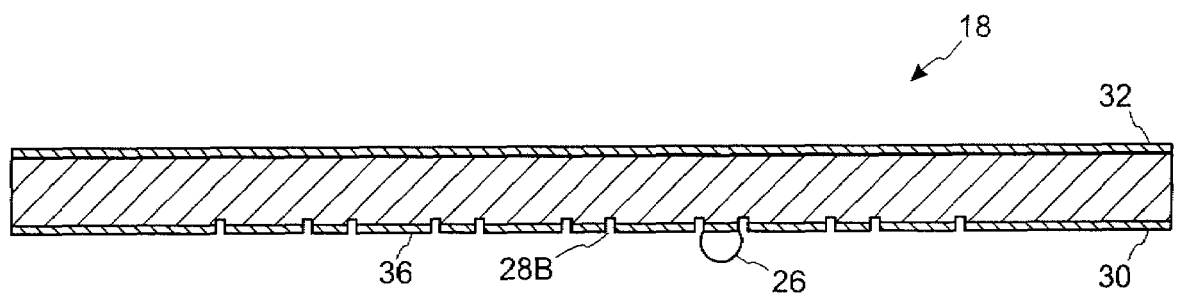
FIG. 6 is a cross-sectional view of the heat spreader of FIG. 5 with a solder ball attached.
Figure 7:
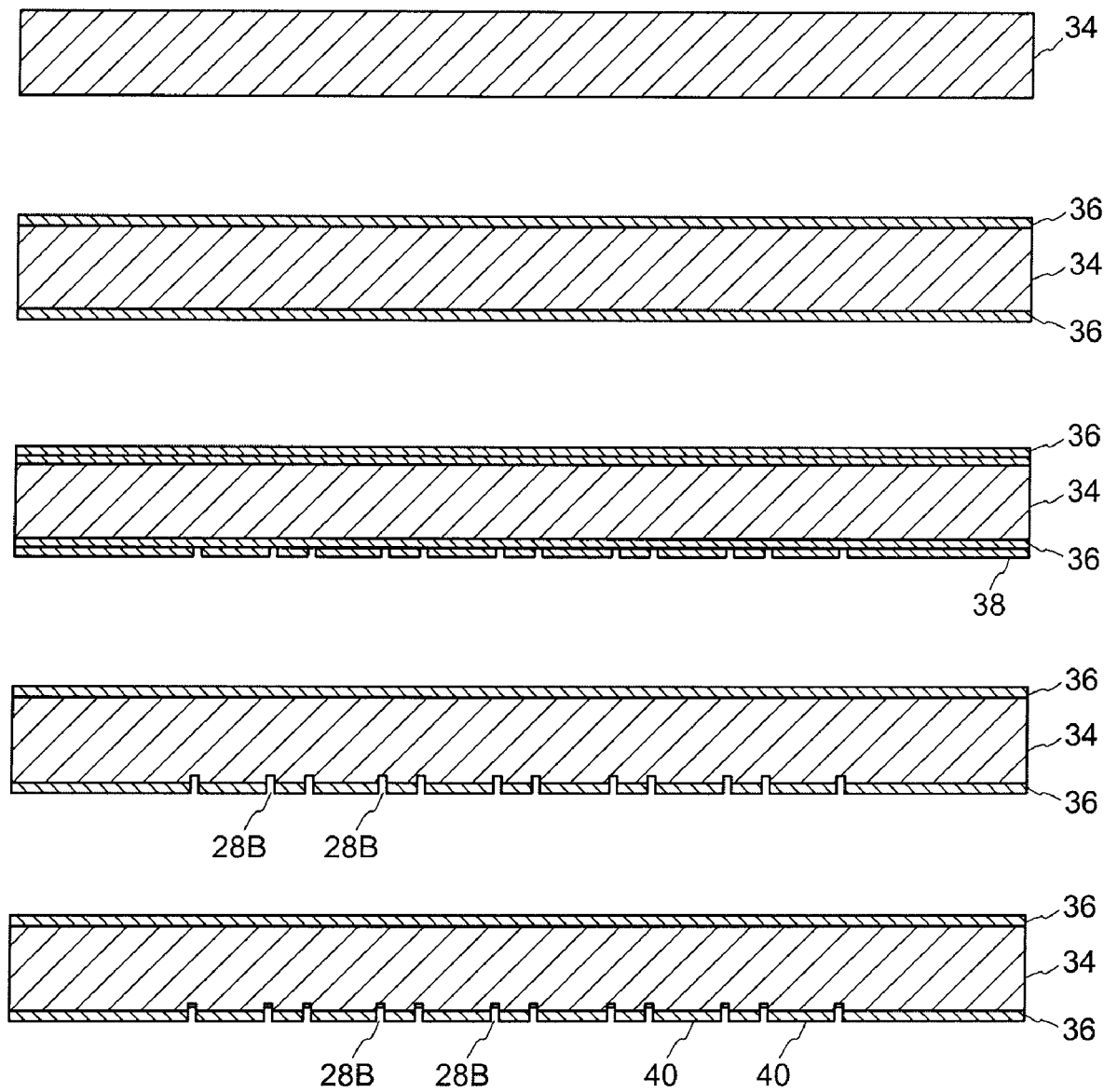
FIG. 7 is a process diagram showing the process of forming the heat spreader shown in FIG. 5.

Referring to FIGS. 5 and 6, the heat spreader 18 has a plurality of annular rings 28B as the retaining members 28. The annular rings 28B are formed on the second surface 30 of the heat spreader 18 opposite of the first surface 32 that is coupled to the semiconductor die 16. The annular rings 28B may be formed on the second surface 30 of the heat spreader 18 in any desired solder ball configuration pattern.

Referring to FIG. 6, the heat spreader 18 has a metal substrate 34. The metal substrate 34 is made of a material that has a high thermal conductivity and that conducts heat well. In general, a metal such as copper or the like is used. It should be noted that the above listing is given as an example and should not be seen as to limit the scope of the present invention. The metal substrate 34 is then plated with a metal layer 36. The metal layer 36 is a metal that solder will wet to, and also serve to protect the underlying copper during the black oxide process, as described below. In general, a metal layer such as nickel, silver, gold, palladium, or the like is used as the metal layer 36. A retaining member pattern is formed on the metal layer 36 by applying an etch resist 38 to the metal layer 36. In the present embodiment, the retaining member pattern is an annular ring 28B. The retaining member pattern is formed in an array to match the desired solder ball configuration pattern. The etch resist 38 is applied on the second surface 30 of the heat spreader 18 opposite of the first surface 32 coupled to the semiconductor die 16. An etching process is then used to remove the metal layer 36 to expose portions of the metal substrate 34 and to form the plurality of annular rings 28B. After the etching process, a black oxide 40 step is performed. The black oxide 40 process is a wet caustic bath which oxides the exposed portions of the metal substrate 34. Thus, if the metal substrate 34 is made of copper, the black oxide 40 process will oxide the exposed cooper to copper oxide CuO. The black oxide 40 process dramatically increases the available surface area for adhesion. Solder balls 26 are then positioned in a center area of each annular ring 28B. During the reflow process to couple the solder balls 26 to the heat spreader 18, the annular rings 28B prevents the solder balls 26 from wetting out onto other surfaces of the heat spreader 18. Thus the solder balls 26 are able to retain a spherical shape.

It should be noted that in the above embodiments, instead of forming the retaining members 28 by chemical etching, a stamping process may be used. A press may be used to stamp the metal layer to form the plurality of retaining members.

Figure 8:
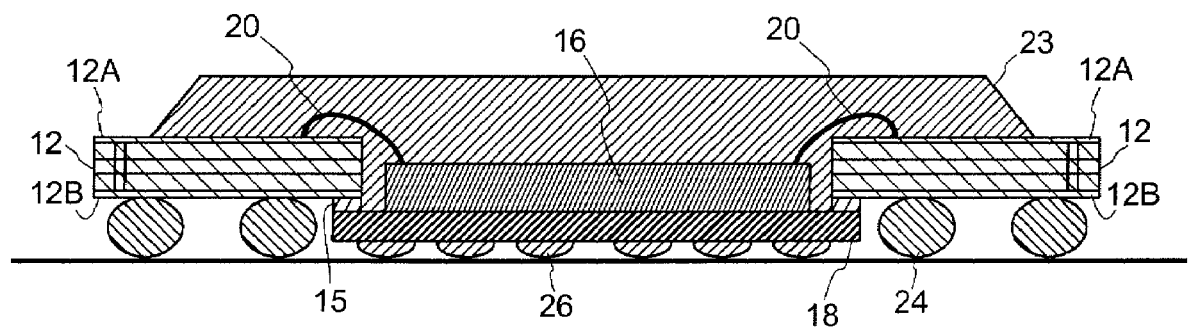
FIG. 8 is a cross-sectional view of another embodiment of the semiconductor package.

Referring to FIG. 8, another embodiment of the package 10A is shown. In this embodiment, the heat spreader 18 is attached to the substrate 12 by an adhesive material 15. That is, the first surface 32 of the heat spreader 18 is attached to the second surface 12b of the substrate with the adhesive material 15. The second set of solder balls 26 is smaller than the first set of solder balls 24.

This disclosure provides exemplary embodiments of the present invention. The scope of the present invention is not limited by these exemplary embodiments. Numerous variations, whether explicitly provided for by the specification or implied by the specification, such as variations in structure, dimension, type of material and manufacturing process may be implemented by one of skill in the art in view of this disclosure.

What is claimed is:

1. A semiconductor package comprising:
a substrate having a first surface, a second surface, and a through hole opening;
a heat spreader having a first surface and a second surface, a metal layer applied on the second surface of the heat spreader, a plurality of notches formed in the metal layer and exposing a metal substrate of the heat spreader;
a semiconductor die coupled to the first surface of the heat spreader, wherein the semiconductor die is electrically coupled to the substrate;
an encapsulant covering portions of the first surface of the substrate, portions of the first surface of the heat spreader, and the semiconductor die;
a first set of solder balls coupled to the second surface of the substrate; and
a second set of solder balls located in the notches and attached to the metal substrate.

2. The semiconductor package of claim 1, wherein the first surface of the heat spreader is coupled to the second surface of the substrate.

3. The semiconductor package of claim 1, wherein the heat spreader is placed in the through hole opening of the substrate.

4. The semiconductor package of claim 3, wherein the second surface of the substrate is substantially coplanar with the second surface of the heat spreader.

5. The semiconductor package of claim 1, further comprising a metal layer formed on the second surface of the heat spreader.

6. The semiconductor package of claim 5, wherein the metal layer is formed of a metal that resists wetting of the solder balls.

7. The semiconductor package of claim 6, wherein the metal layer is selected from the group consisting of nickel, silver, gold, and palladium.

8. A semiconductor package comprising:
   a substrate having a first surface, a second surface, and a through hole opening;
   a heat spreader having a first surface and a second surface, a metal layer a lied on the second surface of the heat spreader, a plurality of annular rings formed in the metal layer and exposing a metal substrate of the heat spreader;
   a semiconductor die coupled to the first surface of the heat spreader, wherein the semiconductor die is electrically coupled to the substrate;
   an encapsulant covering portions of the first surface of the substrate, portions of the first surface of the heat spreader, and the semiconductor die;
   a first set of solder balls coupled to the second surface of the substrate; and
   a second set of solder balls located in the annular rings and attached to the metal substrate.

9. The semiconductor package of claim 8, wherein the first surface of the heat spreader is coupled to the second surface of the substrate.

10. The semiconductor package of claim 8, wherein the heat spreader is placed in the through hole opening of the substrate.

11. The semiconductor package of claim 9, wherein the second surface of the substrate is substantially coplanar with the second surface of the heat spreader.

12. The semiconductor package of claim 8, further comprising a metal layer formed on the second surface of the heat spreader.

13. The semiconductor package of claim 12, wherein the metal layer is formed of a metal that resists wetting of the solder balls.

14. The semiconductor package of claim 13, wherein the metal layer is selected from the group consisting of nickel, silver, gold, and palladium.

15. A semiconductor package comprising:
   a substrate having a first surface, a second surface, and a through hole opening;
   a heat spreader having a first surface and a second surface, a metal layer applied on the second surface of the heat spreader, and means formed in the metal layer and exposing a metal substrate for retaining solder balls to the second surface of the heat spreader;
   a semiconductor die coupled to the first surface of the heat spreader, wherein the semiconductor die is electrically coupled to the substrate;
   an encapsulant covering portions of the first surface of the substrate, portions of the first surface of the heat spreader, and the semiconductor die;
   a first set of solder balls coupled to the second surface of the substrate; and
   a second set of solder balls located in the retaining means and attached to the exposed metal substrate.

16. The semiconductor package of claim 15, wherein the first surface of the heat spreader is coupled to the second surface of the substrate.

17. The semiconductor package of claim 15, wherein the heat spreader is placed in the through hole opening of the substrate.

18. The semiconductor package of claim 17, the second surface of the substrate is substantially coplanar with the second surface of the heat spreader.

19. The semiconductor package of claim 15, wherein the retaining means is a plurality of notches formed in the second surface of the heat spreader.

20. The semiconductor package of claim 15, wherein the retaining means is a plurality of annular rings formed in the second surface of the heat spreader.

* * * * *